United States Patent [19]

Dreschhoff et al.

[11] 4,200,506
[45] Apr. 29, 1980

[54] PROCESS FOR PROVIDING IDENTIFICATION MARKINGS FOR GEMSTONES

[76] Inventors: Gisela A. M. Dreschhoff; Edward J. Zeller, both of 2908 W. 19th St., Lawrence, Kans. 66044

[21] Appl. No.: 849,571

[22] Filed: Nov. 8, 1977

[51] Int. Cl.² ................................................ B01J 1/10
[52] U.S. Cl. ................................................ 204/157.1 H
[58] Field of Search ................................. 204/157.1 H

[56] References Cited

U.S. PATENT DOCUMENTS

| | | | |
|---|---|---|---|
| 2,945,793 | 7/1960 | Dugdale | 204/157.1 H |
| 2,998,365 | 8/1961 | Custers et al. | 204/157.1 H |
| 3,657,085 | 4/1972 | Hoffmeister et al. | 204/157.1 H |

*Primary Examiner*—Howard S. Williams
*Attorney, Agent, or Firm*—Leitner, Palan, Martin & Bernstein

[57] ABSTRACT

A method of providing permanent identification markings to gemstones such as diamond crystals by irradiating the gemstone with protons in the desired pattern. The proton bombardment results in a reaction converting the bombarded area into a different crystal lattice than that of the pre-irradiated stone.

12 Claims, 4 Drawing Figures

PROCESS FOR PROVIDING IDENTIFICATION MARKINGS FOR GEMSTONES

BACKGROUND OF THE INVENTION

This invention relates to a method for producing permanent identification markings within gemstones. Specifically, the present invention is directed to a method for producing permanent identification markings in the interior of a gemstone by a predetermined pattern of proton bombardment.

PRIOR ART

Various means of identifying gemstones have been used in the prior art. These methods, however, usually rely on a subjective evaluation of the physical properties of the particular gem such as color, shape, size, weight, dimensions, known flaws and surface irregularities.

The art has also employed various sources of radiation to enhance or alter diamonds having slight value due to undesirable color characteristics. U.S. Pat. No. 2,945,793 teaches a process for coloring diamonds by means of electron irradiation. Custers et. al., in U.S. Pat. No. 2,998,365 employ electrons or slow neutrons to improve the color of diamonds. Schulke (*Nucleonics*, February, 1963, pp. 68-70) mentions the use of alpha particles, protons, deuterons and neutrons to color diamonds some shade of green.

Radiation has been employed by the prior art to mark products such as eye glass lenses and contact lens for identification. Methods such as those seen in U.S. Pat. Nos. 1,475,473; 3,657,085; and 4,039,827 have been shown for this purpose.

The art is also aware that interior chemical reactions are known to occur when diamonds are bombarded with protons (Zeller et. al., *Zeitschrift Fur Naturforschung*, 23a, 953-954, 1968; Zeller et. al., *Modern Geology*, 1, 141-148, 1970; and Virmani et.al., *Modern Geology* 3, 43-51, 1971).

These reactions, however, have caused large areas of transformation forming large black areas in natural diamond crystals. The prior art process as disclosed would cause a great loss of value to gem diamonds.

OBJECTS OF THE INVENTION

It is an object of this invention to provide a permanent method of internally marking gemstones for positive identification.

Another object of this invention is to provide a means for positively marking gemstones for identification that is undetectable to the naked eye.

Another object of this invention is to provide microscopic identifying marks within the crystal lattice of gemstones which can be traced and which would provide positive identification of the gem in case of theft.

A further object of this invention is to provide a method of personalizing gemstones.

The present invention achieves the objects set forth by irradiating gemstones such as natural diamond crystals with monoenergetic protons from a Van de Graaff accelerator in such a manner that only certain predetermined and discrete internal portions of the gemstone crystal undergo transformation into a different crystal lattice.

The proton bombardment is directed by a suitable proton mask such as a metal template between the gemstone crystal and the proton source so that the irradiation would occur on the crystal only in the predetermined and selected area. The proton mask may be fabricated to only allow proton radiation in the form of numbers, letters or any desired design to pass through to the crystal. The shielded portions of the crystal would be unaffected by the radiation. Furthermore, by controlling the intensity of the proton bombardment, it is possible to produce markings which would be visible only with a microscope and would cause darkening only to the extent needed to make them detectable. The quality of the stone and its refractive properties would be essentially unaffected.

The markings produced by the method of invention are stable and permanent. They are irreversible by any known methods.

DESCRIPTION OF THE PREFERRED EMBODIMENTS

Figure 1:
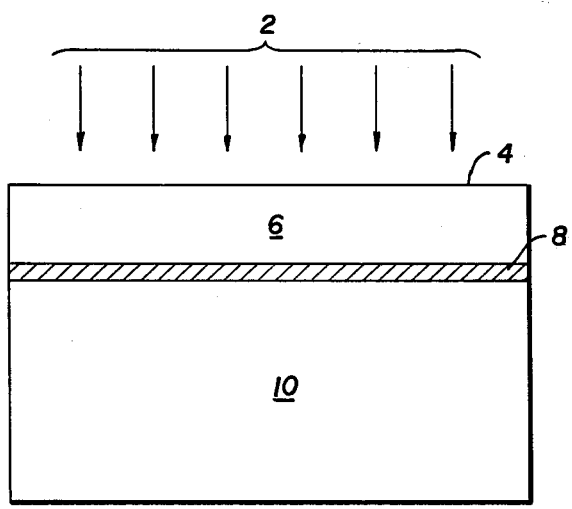
FIG. 1 is a diagrammatic cross-sectional view of a gemstone crystal that has been irradiated.

Referring now to FIG. 1, a gemstone crystal is illustrated that has been bombarded by a proton beam 2. As the protons enter the crystal through surface 4 they lose energy through ionization. The crystal lattice is not strongly heated and no changes occur in area 6 of the crystal. At the end of the proton particle's path, a visible change takes place in a very small and localized region of the crystal lattice shown as area 8. The remainder of the crystal is unchanged and shown herein as area 10.

Figure 2:
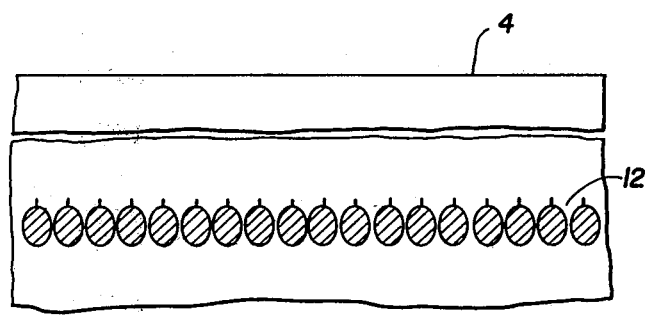
FIG. 2 is a diagrammatic magnified view of the gemstone of FIG. 1.

FIG. 2 shows individual displacement spikes which is the visible change occurring in the small, localized area due to the intense heat produced when the proton particle stops. Each spike as shown may comprise an area of about 0.01 microns in diameter and involve about $10^4$ atoms. The area in which the displacement spikes are developed constitutes a permanent change that is detectable upon microscopic examination and that may only be removed by recutting the crystal to eliminate the affected area.

Figure 3:
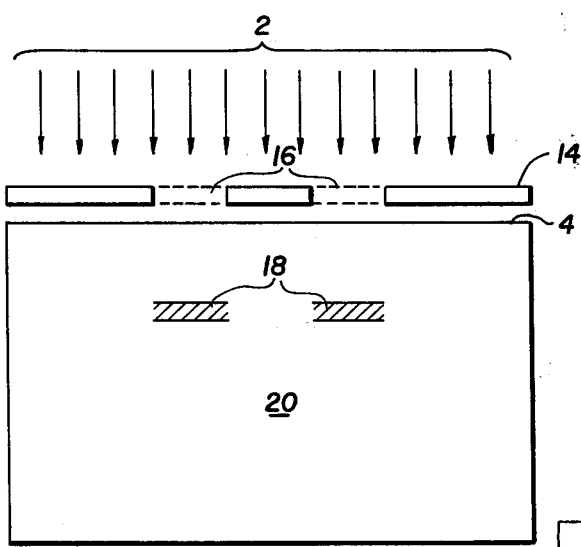
FIG. 3 is a diagrammatic cross-sectional view of a gemstone crystal that has been irradiated through a template having two openings.

FIG. 3 is similar to FIG. 1 except that a metal template 14 has been inserted between proton beam 2 and crystal surface 4. In this illustration, the proton beam 2 only penetrates the crystal through openings 16 that have been etched in template 14. Accordingly, the only areas of detectable change are shown as areas 18. The remainder of the crystal 20 is unaffected.

Figure 4:
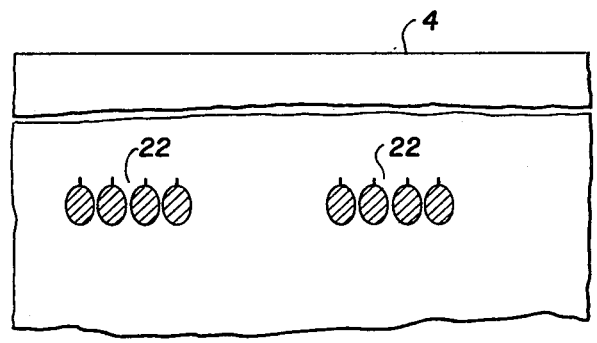
FIG. 4 is a diagrammatic magnified view of FIG. 3.

FIG. 4 is similar to FIG. 2 and shows the displacement spikes that occur after template 14 has been used.

When natural diamond crystals ae irradiated with monoenergetic protons from a Van de Graaff accelerator, permanent changes take place in the crystals at the point where the particles come to rest. If particle energies in the range from about 0.25 MeV to about 4 MeV are used, the crystal surface will not be damaged by sputtering nor will nuclear reactions occur which would render the diamond radioactive after completion of the treatment. The protons with which the gem is bombarded will penetrate the crystal in a well defined and highly predictable manner stopping at a depth of a few microns to several tens of microns depending upon their initial energies. Energy levels in the range of about 0.7 MeV to 2 MeV are preferred. When the particles enter the crystals they first lose energy through ionization and the crystal lattice is not strongly heated. However, at the end of the particle's path a detectable change in the crystal lattice takes place in a very small and localized region. This region is characterized by the development of displacement spikes which result from the intense localized heating caused when the particle stops at the end of its path through the crystal. The zone in which the displacement spikes are developed constitutes a permanent change which is visible upon microscopic examination and could only be removed by cutting away the affected area on the stone.

Cooling the crystal during irradiation keeps the bulk temperature low so that the structural changes occuring by the displacement spike is confined to a localized zone. The lattice change in the stopping region causes the previously optically transparent portion of the crystal to become highly absorptive to visible light.

The depth of penetration of the protons into the crystal lattice is directly proportional to the energy level employed. Accordingly, it is possible to produce identification markings at different depths below the crystal surface.

EXAMPLE

Single crystals of natural diamond were irradiated with protons ranging in energy from 0.7 MeV to 1.8 MeV. The particle beam was supplied by a Van de Graaff accelerator. Approximately $10^{16}$ particles per hour per cm$^2$ were incident upon the crystal with an average beam current of 1.5 microamperes. All irradiations were performed with a defocused beam so that the proton intensity distribution across the beam was as uniform as possible to eliminate formation of hot spots. High particle fluxes were avoided to prevent excessive heating of the target and it was cooled to liquid nitrogen temperature during the irradiations. The duration of the irradiations ranged from a few minutes to several hours. The formation of a thin dark layer is very pronounced after irradiating for 30 minutes. Under these conditions of irradiation, the actual dimensions were approximately as follows:

Average thickness of the crystal: 1 to 2 mm.

Depth of the altered layer below the crystal surface: roughly 15 microns.

Thickness of the altered layer: Approximately 1 micron.

The original color of the bulk volume of the crystal remains unaltered by the treatment. Only the localized areas where the protons come to rest will be affected In diamonds, this effect is a coloration within the stopping region due to the physical properties of the diamond lattice. At atmospheric pressure the lattice is thermodynamically unstable. The intense heating produced when the protons come to rest converts the region of the displacement spike into amorphous carbon. If the heating is maintained for a sufficiently long period the more stable form, graphite, may be produced.

The production of a continuous dark layer below the surface of a diamond as shown by the prior art would greatly reduce its value and render it worthless as a gem. Accordingly, in practicing the invention a proton mask such as a metal template would be introduced between the proton beam and the surface of the gem so that the beam would fall on the crystal only through the perforations etched in the template. These perforations could take any desired form, for example, they could be designed to provide simple dot patterns or they could be produced in complex geometric forms. Numbers, letters or virtually any design could be copied by photoengraving and could be introduced beneath the surface of the stone. Those portions of the diamond which are shielded from the radiation will be unaffected. By controlling the intensity of the proton bombardment it is possible to produce markings which are visible only with a microscope and would cause darkening only to the extent needed to make them detectable. The quality of the stone and its refractive properties would be essentially unaffected.

The method of the invention may also be used to personalize gemstones such as by inserting the owner's initials, childs' name or date. By controlling the intensity of the proton bombardment, markings may be provided that are visible to the naked eye.

By controlling the energy levels and intensity of the proton beam, the method of the invention is adaptable to all gemstones having a crystal lattice, dependent only on the physical and chemical properties of the individual gems.

An advantage of this invention resides in its ability to mark gemstones in such a manner that the marks can be removed only by recutting the stone. If the markings are introduced 20 microns below the surface they could be removed only by cutting away a substantial volume of the gem. Furthermore, if the markings are placed under facets and if a distinctive dot or line pattern is used it would be possible to determine the extent of any recutting which might be done in an attempt to conceal thefts.

The toal volume effected by the method of this invention is very small in proportion of the total volume of the stone.

From the preceding description of the preferred embodiments, it is evident that the objects of the invention are attained and although the invention has been described and illustrated in detail, it is to be clearly understood that the same is by way of illustration and example only and is not to be taken by way of limitation. The spirit and scope of this invention is to be limited only by the terms of the appended claims.

We wish it to be understood that we do not desire to be limited to the exact details of the method shown and described, for obvious modifications can be made by a person skilled in the art.

We claim:

1. A method of providing permanent identification markings within the interior of a gemstone crystal lattice comprising irradiating the crystal by means of proton bombardment in the pattern of the identification mark, said protons being applied at a sufficient flux, energy level and time period to reach a desired depth within the crystal in a sufficient concentration to irreversibly transform an area of a plane normal to the axis of irradiation at said depth in the pattern of the identification mark into a second crystal lattice different from the pre-irradiation crystal lattice, and cooling said gemstone during irradiation to confine said lattice transformation to said area of said plane at said depth.

2. The method of claim 1 wherein the gemstone is diamond and the second crystal lattice is amorphous carbon or graphite.

3. The method of claim 2 wherein the irradiation period is in the range of from a few minutes to several hours.

4. The method of claim 2 wherein a proton mask etched with the identification marking is introduced between the proton source and the diamond.

5. Diamonds having internal identification markings produced by the method of claim 2.

6. The method of claim 2 wherein the proton particle energies are in the range of from about 0.25 MeV to about 4 MeV.

7. The method of claim 6 wherein the proton particle energies are in the range of from 1 MeV to 2 MeV.

8. The method of claim 1 wherein the internal identification markings are small enough to be undetectable to the naked eye.

9. The method of claim 1 wherein the protons are monoenergetic protons from a Van de Graaff accelerator.

10. Gemstones having internal identification markins produced by the method of claim 1.

11. A method of providing permanent identification markings within the interior of a diamond crystal lattice comprising irradiating the diamond by means of a proton bombardment through a proton mask etched in the pattern of the identification mark; said protons being applied within an energy range of about 0.25 MeV to about 4 MeV; said diamond crystal being cooled to the temperature of liquid nitrogen during the irradiating period; whereby the area of the crystal in which the proton stops is transformed into amorphous carbon or graphite.

12. Diamonds having internal identification markings produced by the method of claim 11.

* * * * *

UNITED STATES PATENT AND TRADEMARK OFFICE
CERTIFICATE OF CORRECTION

PATENT NO. : 4,200,506
DATED : April 29, 1980
INVENTOR(S) : Dreschhoff, et al.

It is certified that error appears in the above-identified patent and that said Letters Patent are hereby corrected as shown below:

Column 2, line 58 delete "ae" and insert therefor -- are -- .

Column 3, line 53, after "affected" insert -- . -- .

Column 4, line 36, delete "toal" and insert therefor -- total --

Column 4, line 36, delete "effected" and insert therefore

-- affected -- .

Claim 10, line 1, delete "markins" and insert therefor

-- markings -- .

Signed and Sealed this

Twelfth Day of August 1980

[SEAL]

Attest:

SIDNEY A. DIAMOND

Attesting Officer

Commissioner of Patents and Trademarks